(12) United States Patent
Chen

(10) Patent No.: US 8,641,446 B1
(45) Date of Patent: Feb. 4, 2014

(54) COAXIAL PROBE

(75) Inventor: Wen-Feng Chen, Tainan (TW)

(73) Assignee: Chin Nan Precision Electronics Co., Ltd., Tainan (TW)

( * ) Notice: Subject to any disclaimer, the term of this patent is extended or adjusted under 35 U.S.C. 154(b) by 4 days.

(21) Appl. No.: 13/559,722

(22) Filed: Jul. 27, 2012

(51) Int. Cl.
*H01R 9/05* (2006.01)

(52) U.S. Cl.
USPC .......................................... 439/578; 439/141

(58) Field of Classification Search
USPC .......................................... 439/578, 140, 141
See application file for complete search history.

(56) References Cited

U.S. PATENT DOCUMENTS

| | | | | |
|---|---|---|---|---|
| 2,082,986 A | * | 6/1937 | Staley | 439/140 |
| 3,742,426 A | * | 6/1973 | Huber et al. | 439/141 |
| 4,941,846 A | * | 7/1990 | Guimond et al. | 439/578 |
| 7,556,529 B2 | | 7/2009 | Wakamatsu et al. | |
| 7,785,143 B2 | * | 8/2010 | Zhang et al. | 439/578 |
| 2003/0040219 A1 | * | 2/2003 | Lin et al. | 439/578 |
| 2011/0244720 A1 | * | 10/2011 | Peng | 439/578 |

FOREIGN PATENT DOCUMENTS

TW  I291269 B  12/2007

* cited by examiner

*Primary Examiner* — James Harvey
(74) *Attorney, Agent, or Firm* — Rosenberg, Klein & Lee

(57) ABSTRACT

A coaxial probe is revealed. A protective sleeve is mounted in a sleeve port of a main sleeve. A leaning flange projecting inward is formed on a bottom end of a sleeve port of the main sleeve. The leaning flange is stopped and positioned by a stopping flange on an upper part of the protective sleeve. A probe is disposed on a sleeve port of the main sleeve and is passed through a sleeve port of a protective hole. Thus the probe is hidden in the protective sleeve. After the protective sleeve being in contact with a coaxial connector to be detected, the probe is moved to project from the protective sleeve for detecting the coaxial connector. Thereby damages of the probe caused by impact force received can be avoided.

10 Claims, 6 Drawing Sheets

COAXIAL PROBE

BACKGROUND OF THE INVENTION

1. Field of the Invention

The present invention relates to a coaxial probe, especially to a coaxial probe that effectively prevents a probe thereof from being damaged due to impact force received.

2. Description of Related Art

The design of coaxial terminals provides great convenience in assembly of two electronic devices. During the assembly of two coaxial terminals, they may be not assembled correspondingly or easy get loose after being connected due to size errors or insufficient mating/unmating force, etc. Refer to Taiwanese Pat. Pub. No. 1291269 coaxial connector and measuring coaxial probe, a coaxial probe is disclosed. However, a center conductive probe of the coaxial probe revealed in the Taiwanese Pat. Pub. No. 1291269 is projecting from the housing and exposed outside. When the coaxial probe is moved downward to be inserted into a socket thereunder correspondingly, the center conductive probe exposed outside the housing is firstly entering the socket. Once a central hole of the socket is a bit tilted (not aligned), the center conductive probe receives an impact force firstly. The center conductive probe is as fine as a needle and is of low structural strength. The center conductive probe is still tilted or get broken due to the impact force even there is a coil spring disposed above the center conductive probe capable of buffering the impact force. This leads to imprecision of next probing cycle.

SUMMARY OF THE INVENTION

Therefore it is a primary object of the present invention to provide a coaxial probe that prevents a probe thereof from being damaged due to impact force received.

In order to achieve the above object, a coaxial probe according to the present invention includes a main sleeve, a protective sleeve mounted in a sleeve port of the main sleeve and a probe portion. A leaning flange projecting inward is formed on a bottom end of the sleeve port of the main sleeve so as to be stopped and positioned by a stopping flange on an upper part of the protective sleeve. A connection member is disposed over the sleeve port of the main sleeve and is used to assemble with a probe of a probe portion. Moreover, the probe is inserted into a sleeve port of the protective sleeve and is hidden in the sleeve port of the protective sleeve. An elastic member for protective sleeves is arranged between the connection member mounted in the sleeve port of the main sleeve and the stopping flange of the protective sleeve.

Thereby the probe of the coaxial probe according to the present invention is hidden in the protective sleeve. After the protective sleeve being in contact with a coaxial connector to be detected, the probe continues to move and project from the protective sleeve for detecting the coaxial connector. Thus the fragile probe will not be affected by the impact force directly and damages of the probe caused by the impact force can be avoided.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
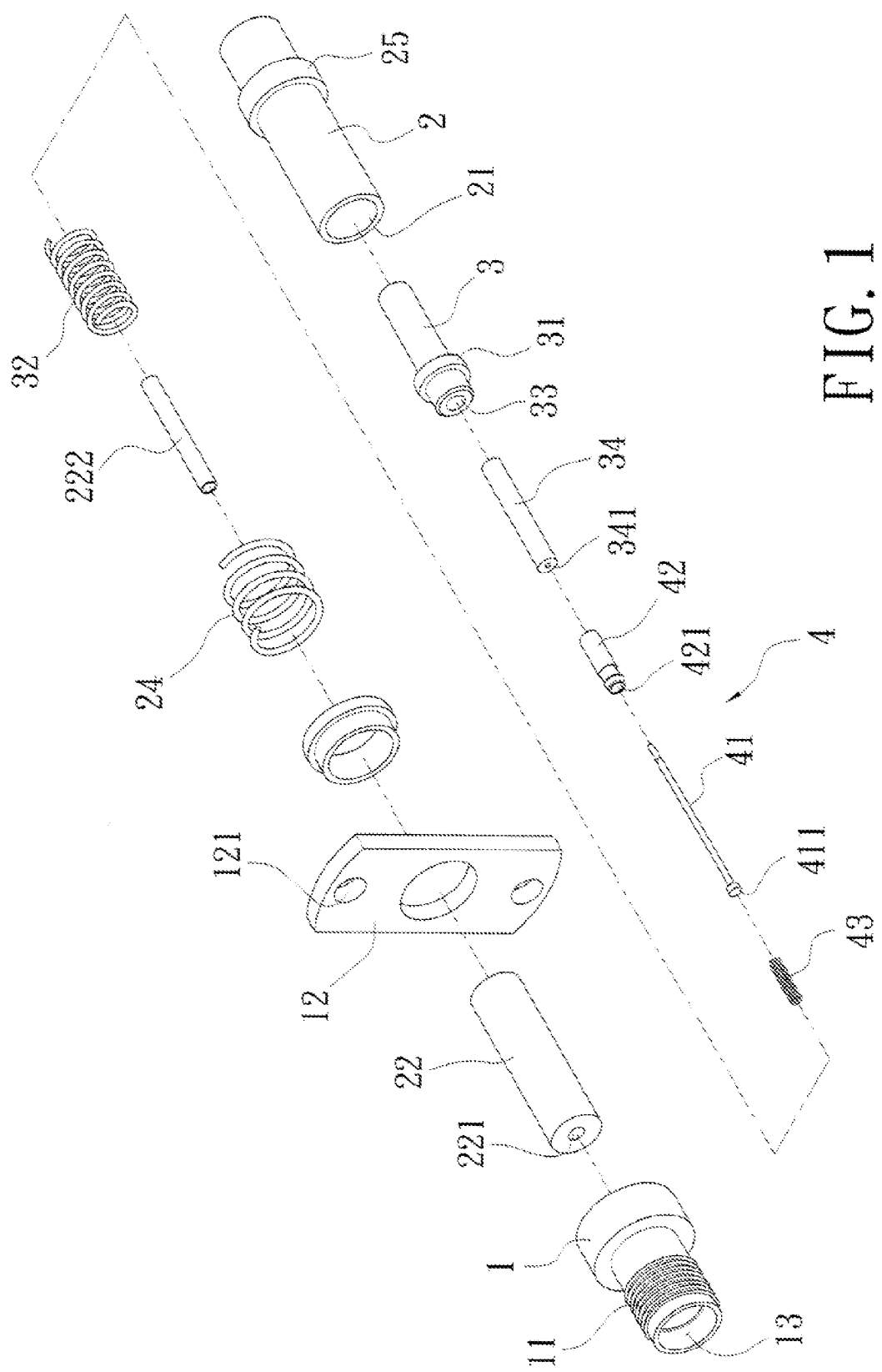
FIG. 1 is an explosive view of an embodiment according to the present invention.
Figure 2:
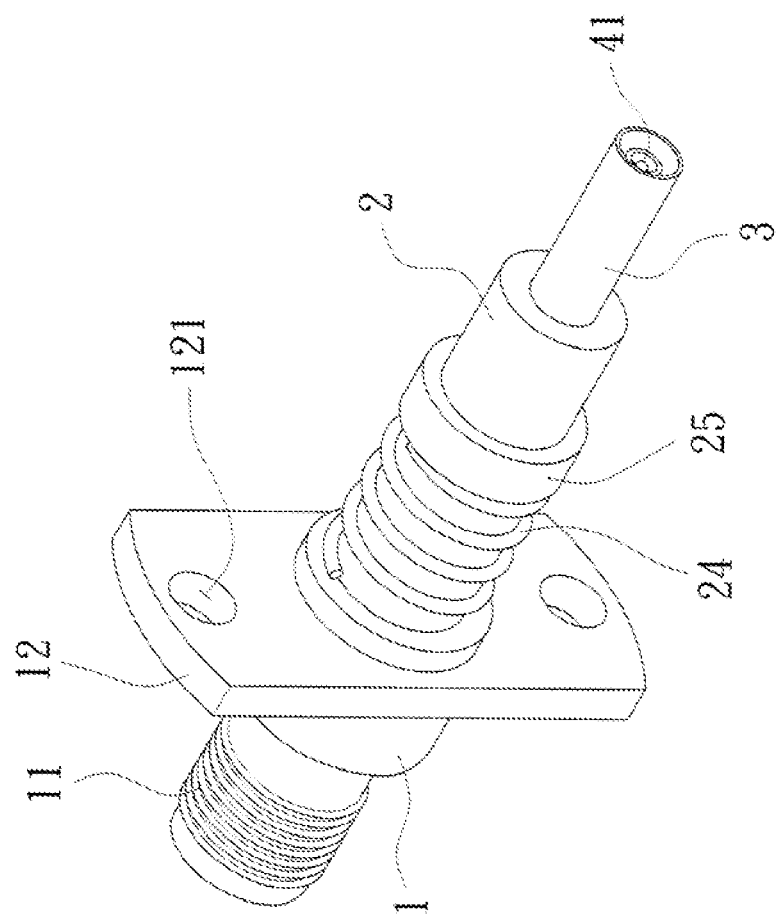
FIG. 2 is a perspective view of an embodiment according to the present invention.
Figure 3:
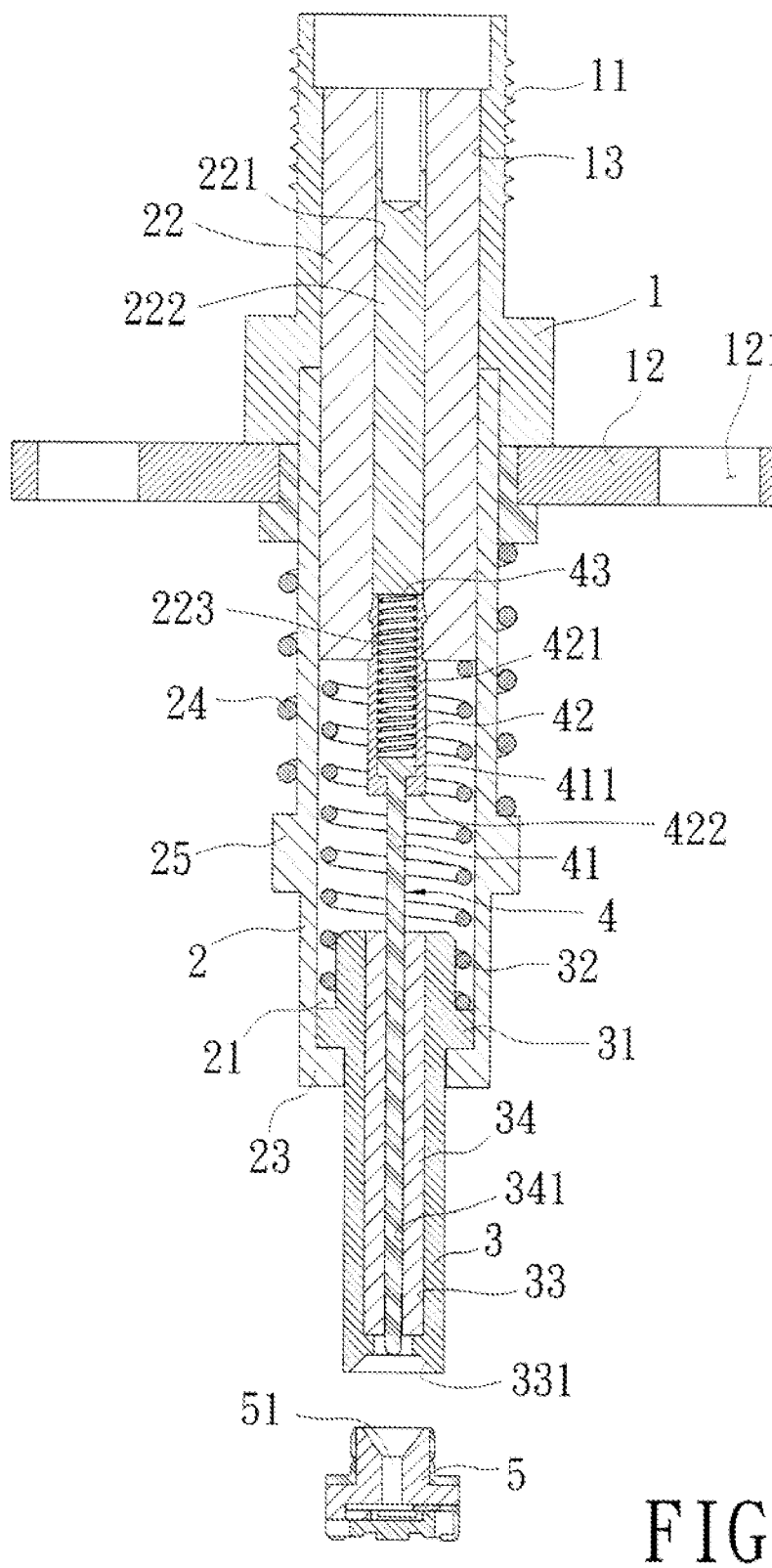
FIG. 3 is a cross sectional view of an embodiment according to the present invention.

Refer from FIG. 1 to FIG. 3, a coaxial probe of the present invention mainly includes an assembly base 1, a main sleeve 2, a protective sleeve 3 a probe portion 4.

The assembly base 1 is disposed with a threaded segment 11 on an outer wall thereof and a through hole 13 on a center thereof. A connection disc 12 with a plurality of fastening holes 121 is arranged at the assembly base 1, under the threaded segment 11.

The main sleeve 2 is disposed under the assembly base 1 and a top end of the main sleeve 2 is mounted into the through hole 13 of the assembly base 1. A sleeve port 21 is arranged at a center of the main sleeve 2. A connection member 22 is mounted in the sleeve port 21 of the main sleeve 2 and the through hole 13 of the assembly base 1. An insertion hole 221 is located on a center of the connection member 22 and a plunger rod 222 is mounted in the insertion hole 221 of the connection member 22. A connection segment 223 is formed between the bottom edge of the insertion hole 221 of the connection member 22 and the plunger rod 222. A leaning flange 23 projecting inward is formed on the bottom end of the sleeve port 21 of the main sleeve 2. Moreover, an elastic member 24 for main sleeves is arranged around the main sleeve 2 while a top and a bottom end of the elastic member 24 for main sleeves are respectively against the bottom of the assembly base 1 and a step-like flange 25 arranged on an outer wall of the main sleeve 2.

The protective sleeve 3 is sleeved in a bottom end of the sleeve port 21 of the main sleeve 2. A stopping flange 31 is projected from an outer wall on an upper part of the protective sleeve 3. The stopping flange 31 and the leaning flange 23 on the bottom end of the sleeve port 21 of the main sleeve 2 are stopped and positioned by each other. Furthermore, an elastic member 32 for protective sleeves is arranged between the stopping flange 31 of the protective sleeve 3 and the bottom end of the connection member 22 mounted in the sleeve port 21 of the main sleeve 2. A guiding rod 34 is mounted in a sleeve port 33 of the protective sleeve 3. A guiding hole 341 is arranged at a center of the guiding rod 34 and a tapered (trumpet-shaped) opening 331 is formed on the bottom of the sleeve port 33 of the protective sleeve 3.

The probe portion 4 consists of a probe 41, an axial sleeve 42, and an elastic member 43 for probes. The probe 41 is received in the guiding hole 341 of the guiding rod 34 of the protective sleeve 3 and is not exposed. A top end of the probe 41 is inserted through an axial hole 421 of the axial sleeve 42. A leaning flange 422 projecting inward is formed on the bottom end of the axial hole 421 of the axial sleeve 42. A stopping block 411 is arranged at the top end of the probe 41. The leaning flange 422 and the stopping block 411 are stopped and positioned by each other. The top of the axial sleeve 42 is connected to and assembled with the connection segment 223 located between the insertion hole 221 and the plunger rod 222. The elastic member 43 for probes is mounted in the axial hole 421 of the axial sleeve 42 and a top end of the elastic member 43 for probes is against the plunger rod 222 in the connection member 22 while a bottom end of the elastic member 43 is against the stopping block 411 of the probe 41.

Thereby while being assembled, refer to FIG. 3, the protective sleeve 3 is firstly mounted into the sleeve port 21 of the main sleeve 2. Due to gravity, the protective sleeve 3 falls to the bottom of the main sleeve 2. Thus the stopping flange 31 on the outer wall of the upper part of the protective sleeve 3 is stopped and positioned by the leaning flange 23 on the bottom end of the sleeve port 21 of the main sleeve 2. Then the elastic member 32 for protective sleeves is mounted into the sleeve port 21 of the main sleeve 2 and the bottom of the elastic member 32 for protective sleeves is against the stopping flange 31 of the protective sleeve 3. Next the probe 41 of the probe portion 4 is inserted through the axial hole 421 of the axial sleeve 42 and the probe 41 also falls due to gravity. Thus the stopping block 411 on top end of the probe 41 is stopped and positioned by the leaning flange 422 on the bottom of the axial sleeve 42. Then the elastic member 43 for probes is set into the axial hole 421 of the axial sleeve 42. The top end of the axial sleeve 42 is connected to the connection segment 223 of the connection member 22 and is against the plunger rod 222 already inserted in the insertion hole 221 of the connection member 22. Then the probe 41 of the probe portion 4 connected to the connection member 22 is inserted into the guiding hole 341 of the guiding rod 34 of the protective sleeve 3 and is not extended from the protective sleeve 3. At the same time, the bottom end of the connection member 22 is mounted into the sleeve port 21 of the main sleeve 2 and then the elastic member 24 for main sleeve is disposed around the main sleeve 2. The top end of the main sleeve 2 is sleeved into the through hole 13 of the assembly base 1. The top end and the bottom end of the elastic member 24 for main sleeve are respectively against the bottom of the assembly base 1 and the step-like flange 25 of the main sleeve 2 for being positioned. As to the threaded segment 11 and the connection disc 12 of the assembly base 1, they are used to assemble with a lift power source.

Figure 4:
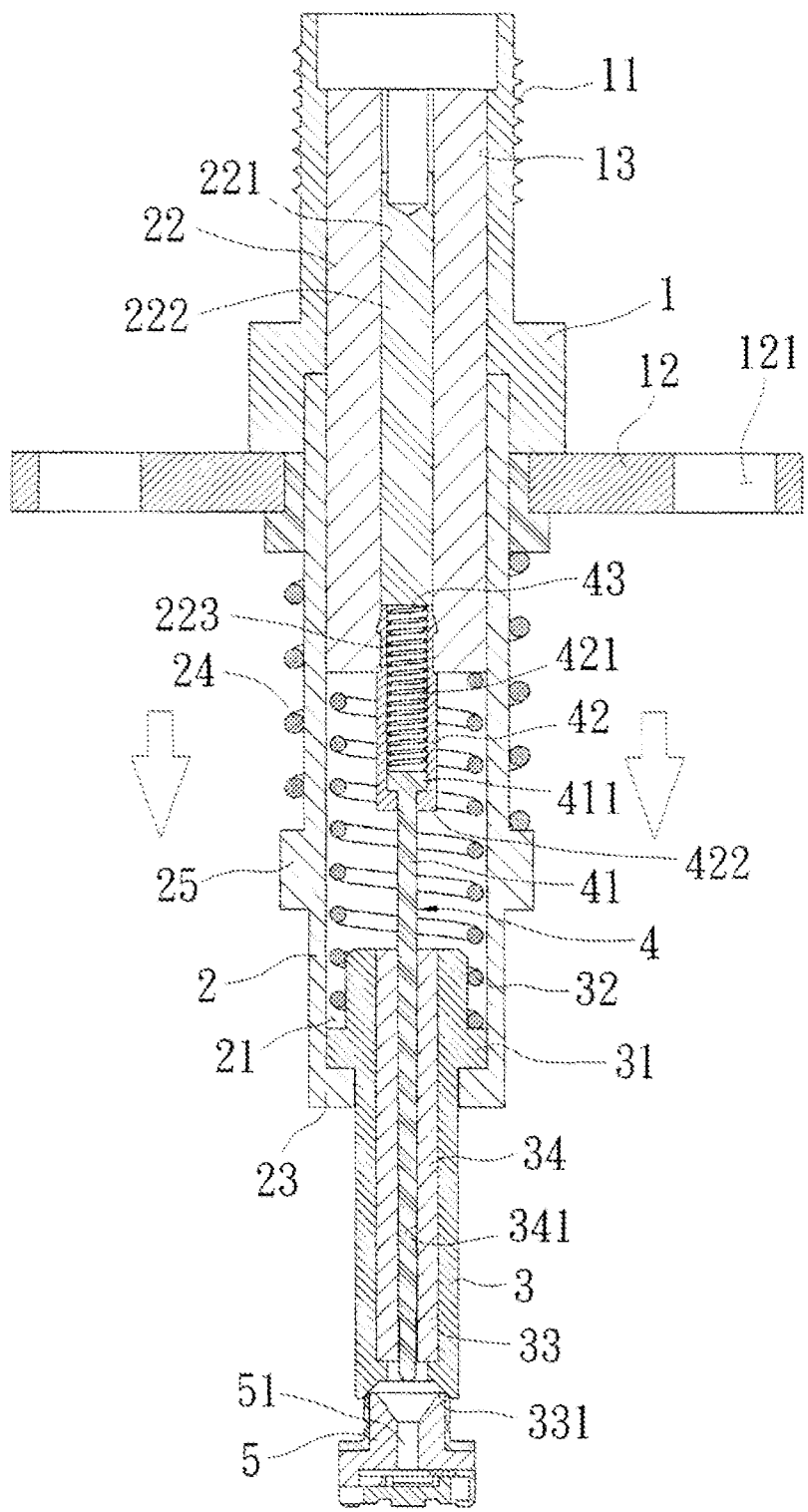
FIG. 4 is a cross sectional view showing detection of an embodiment according to the present invention.
Figure 5:
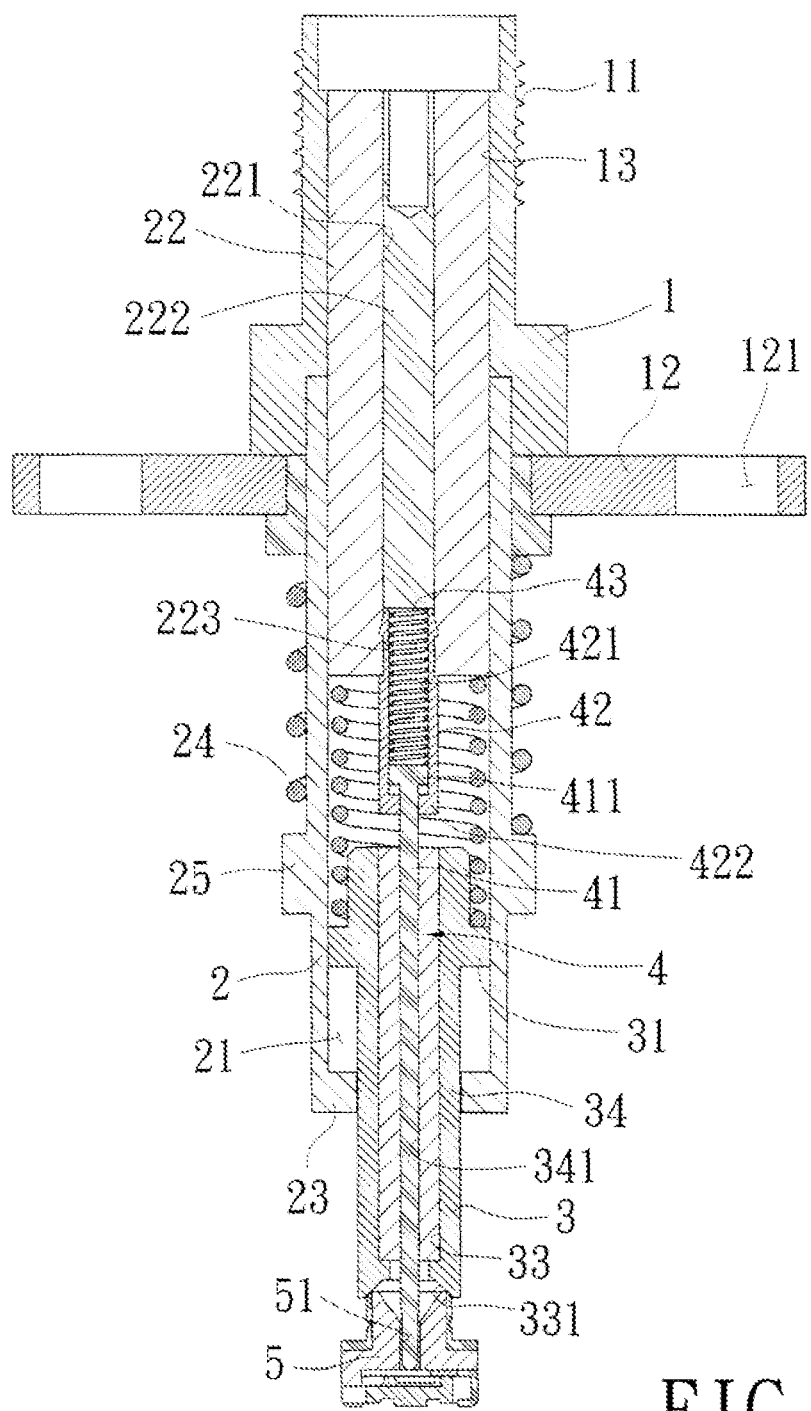
FIG. 5 is a cross sectional view showing an extended probe during diction of an embodiment according to the present invention.

While performing quality control detection of a coaxial connector, refer to FIG. 4, a coaxial connector 5 intended to be detected is set under the coaxial probe of the present invention. Then the lift power source connected to the coaxial probe of the present invention works to move the coaxial probe downward. When the coaxial probe reaches the coaxial connector 5 being detected, the tapered opening 331 on the bottom of the protective sleeve 3 is in contact with the coaxial connector 5 being detected firstly so as to align the coaxial probe of the present invention with the coaxial connector 5 being detected. Next by the elastic member 24 between the step-like flange 25 of the main sleeve 2 and the bottom of the assembly base 1, the direction of a force the lift power source applied to the assembly base 1 is automatically guided. Thus the assembly base 1 and the main sleeve 2 assembled with the assembly base 1 are both moved downward stably. Through the connection member 22 in the main sleeve 2, the probe portion 4 connected is driven to move downward synchronously. Now refer to FIG. 5, the elastic member 32 for protective sleeves between the bottom end of the connection member 22 of the main sleeve 2 and the stopping flange 31 of the protective sleeve 3 is compressed. Moreover, the probe 41 of the probe portion 4 is projecting from the protective sleeve 3 along the guiding hole 341 of the protective sleeve 3 to be inserted into an insertion hole 51 of the coaxial connector 5 being detected so as to detect the position of the insertion hole 51 of the coaxial connector 5 and electrical quality of electronics therein. Furthermore, by the elastic member 43 for probes located on the rear end of the probe 41 and used for providing elastic buffer, the probe 41 will not get damaged easily when the position and straightness of the insertion hole 51 of the coaxial connector 5 are not correct.

Figure 6:
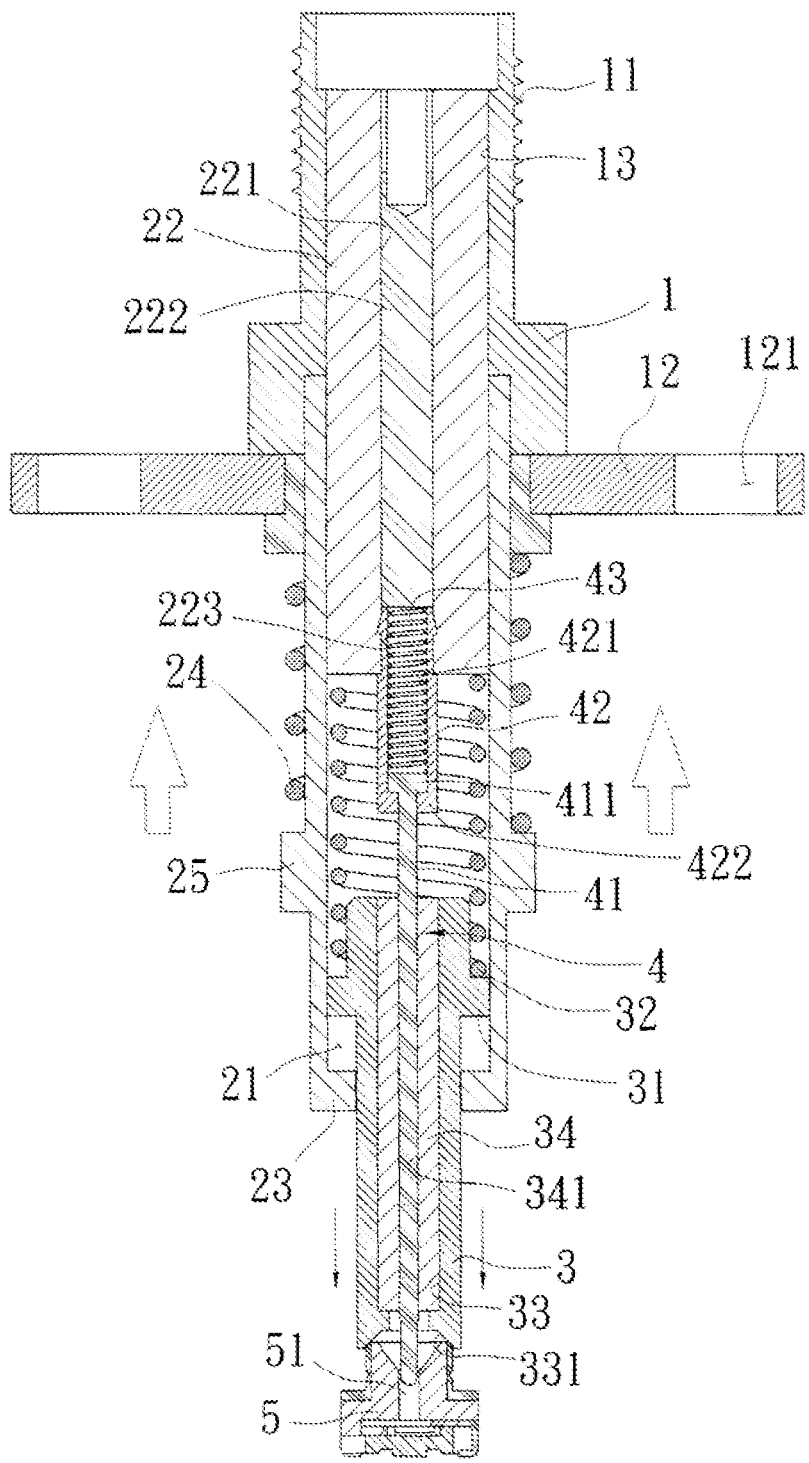
FIG. 6 is a cross sectional view showing turning back of an embodiment according to the present invention.

After the coaxial probe of the present invention completing detection of the coaxial connector 5 being detected, refer to FIG. 6, the lift power source drives the assembly base 1 connected thereof to move upward and go back to the original position. At the same time, the main sleeve 2 connected to the assembly base 1 is also driven to move upward and go back. Thus the probe 41 originally projecting out of the protective sleeve 3 is retracted into the protective sleeve 3 gradually. When the assembly base 1, the main sleeve 2 and the probe portion 4 are turning back upward, the elastic member 32 for protective sleeves arranged between the connection member 22 of the main sleeve 2 and the stopping flange 31 of the protective sleeve 3 are also returning to the original state. Thus the protective sleeve 3 is pushed to move downward so as to make the probe 41 retract into the protective sleeve 3 completely. Now the coaxial probe of the present invention is ready for the next detection of the coaxial connector 5.

In the coaxial probe of the present invention, the probe 41 with low structural strength is mounted in the protective sleeve 3. When the coaxial probe is moved downward to be in contact with the coaxial connector 5 thereunder, the protective sleeve 3 is against and positioned by the coaxial connector 5 to be detected firstly and then the probe 41 is extended from the protective sleeve 3 to detect the position of the insertion hole 51 of the coaxial connector 5 and the electrical quality of electronic components therein. Therefore the probe 41 will not easily get damaged or broken due to impact force received and imprecise detection results can be avoided.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A coaxial probe comprising
   a main sleeve disposed with a sleeve port and having a leaning flange projecting inward formed on a bottom end of the sleeve port of the main sleeve and a connection member mounted into the sleeve port of the main sleeve;
   a protective sleeve sleeved in the sleeve port of the main sleeve and arranged with a stopping flange on an upper part thereof; the leaning flange and the stopping flange are stopped and positioned by each other; and
   a probe portion having a probe that is connected to the connection member and inserted into a sleeve port of the protective sleeve to be hidden in the sleeve port of the protective sleeve; an elastic member for protective sleeves is arranged between the connection member mounted in the sleeve port of the main sleeve and the stopping flange of the protective sleeve.

2. The device as claimed in claim 1, wherein the probe portion includes the probe, an axial sleeve, and an elastic member for probes; the axial sleeve is disposed with an axial hole for receiving a top end of the probe; a leaning flange projecting inward is formed on a bottom end of the axial hole of the axial sleeve; a stopping block is disposed on a top end of the probe; the stopping block and the leaning flange are stopped and positioned by each other; a top of the axial sleeve is connected to the connection member; the elastic member for probes is mounted in the axial hole of the axial sleeve and a top end of the elastic member for probes is against the connection member while a bottom end of the elastic member for probes is against the stopping block of the probe.

3. The device as claimed in claim 2, wherein a guiding rod is set in a sleeve port of the protective sleeve and a guiding hole is arranged at a center of the guiding rod for receiving the probe.

4. The device as claimed in claim 3, wherein a tapered opening is formed on a bottom of the sleeve port of the protective sleeve.

5. The device as claimed in claim 4, wherein an insertion hole is located on a center of the connection member and a plunger rod is mounted in the insertion hole of the connection member; a connection segment is formed between a bottom edge of the insertion hole of the connection member and the plunger rod and the top of the axial sleeve of the probe portion is connected to the connection segment.

6. The device as claimed in claim 5, wherein the coaxial probe further includes an assembly base that is disposed over the main sleeve; a through hole is arranged at a center of the assembly base and is connected to the connection member disposed over the main sleeve; a connection disc is arranged around the assembly base; a step-like flange is disposed outside the main sleeve and an elastic member for main sleeves is set around the main sleeve while a top and a bottom end of the elastic member for main sleeves are respectively against a bottom of the assembly base and the step-like flange of the main sleeve.

7. The device as claimed in claim 6, a threaded segment is disposed on an upper part of the assembly base.

8. The device as claimed in claim 1, wherein a tapered opening is formed on a bottom of the sleeve port of the protective sleeve.

9. The device as claimed in claim 1, wherein a guiding rod is set in a sleeve port of the protective sleeve and a guiding hole is arranged at a center of the guiding rod for receiving the probe.

10. The device as claimed in claim 1, wherein the coaxial probe further includes an assembly base that is disposed over the main sleeve; a through hole is arranged at a center of the assembly base and is connected to the connection member disposed over the main sleeve; a connection disc is arranged around the assembly base; a step-like flange is disposed outside the main sleeve and an elastic member for main sleeves is set around the main sleeve while a top and a bottom end of the elastic member for main sleeves are respectively against a bottom of the assembly base and the step-like flange of the main sleeve.

* * * * *